United States Patent [19]

Tanabe et al.

[11] 4,344,188

[45] Aug. 10, 1982

[54] BALANCED MODULATOR

[75] Inventors: Kenzo Tanabe, Katano; Junji Suzuki, Neyagawa; Masashi Kanno, Katano, all of Japan

[73] Assignee: Matsushita Electric Industrial Co., Ltd., Kadoma, Japan

[21] Appl. No.: 195,653

[22] Filed: Oct. 9, 1980

[51] Int. Cl.³ .................... H03D 7/14; H03C 1/54; H03C 1/62

[52] U.S. Cl. .................... 455/326; 455/319; 455/333

[58] Field of Search ............... 455/326, 333, 318, 319; 363/159, 163, 164

[56] References Cited

U.S. PATENT DOCUMENTS 4,058,771 11/1977 Ohsawa .......................... 455/333
4,080,573 3/1978 Howell .......................... 455/318
4,216,431 8/1980 Shibata .......................... 455/326
4,253,196 2/1981 Malchow ........................ 455/319
4,268,916 5/1981 Kusakabe ....................... 455/326

Primary Examiner—Howard Britton

[57] ABSTRACT

A balanced modulator for use at the mixer stage of the front end of a signal receiver. The modulator has a transistor balanced modulation circuit of the double balanced type having a plurality of emitter coupled transistor pairs, a circuit for increasing the bias current in the balanced modulation circuit corresponding to an increase in the input signal level, and a circuit for reducing the local oscillation signal applied to the balanced modulation circuit corresponding to an increase in the input signal level so that distortion in the balanced modulation circuit is reduced over a wide range of the level of the input signal.

1 Claim, 3 Drawing Figures

4,344,188

BALANCED MODULATOR

BACKGROUND OF THE INVENTION

This invention relates to a balanced modulator used at a mixer stage of the front end portion of a signal receiver. An object of the invention is to provide a double balanced type balanced modulator which generates less cross modulation distortion and inter modulation distortion correspondingly to an input signal having a wide level range at a signal receiver, and has low noise characteristics with respect to a small input signal level.

FIG. 1 shows a generally well-known double balanced modulation circuit, in which transistors $Q_1$-$Q_2$, and $Q_3$-$Q_4$ and $Q_5$-$Q_6$, are emitter coupled transistor pairs and constitute a basic unit of the double balanced modulator. Transistors $Q_7$-$Q_8$ are constant current transistors with respect to transistors $Q_5$-$Q_6$ and the current values of transistors $Q_7$-$Q_8$ are determined from the current value through a diode $D_1$ used for a current mirror. Resistances $R_1$, $R_2$ and $R_3$ serve to further stabilize operation of the current mirror. Input terminals 1-2 are differential input terminals for local oscillation signal; terminals 3-4 are differential input terminals for a received signal, terminal 5 is a connecting terminal for an external resistance and power source in order to determine the bias current at differential transistor pair $Q_5$-$Q_6$; terminal 6 is a ground terminal; terminals 7-8 are differential output terminals of the balanced modulation circuit; terminals 9-10 are external resistance connecting terminals for adjusting the frequency conversion conductance of the balanced modulation circuit. Principal characteristics of the balanced modulation circuit in FIG. 1 are represented by frequency conversion conductance, noise figure and maximum acceptable signal input, which are determined by the value of external resistance connected to terminals 9-10, the bias current values of differential transistor pair $Q_5$-$Q_6$, and the level of the local oscillator signal applied to terminals 1-2. Namely, the value of external resistance connected between terminals 9-10 is represented by $R_E$, frequency conversion conductance gm is given substantially by the following equation:

$$gm = k(1/R_E) \quad (1),$$

where k is a constant dependent on a local signal level applied to differential input terminals 1-2 for a local oscillator signal, and converges into a constant value equal to $4/\pi$ if the injection signal level is of a sufficiently large value. The noise figure, which is affected by the local signal level, the external resistance connected between the terminals 9 and 10, and the signal source impedance of received signal connected to terminals 3-4, is greatly affected by bias currents in the differential transistor pair $Q_5$-$Q_6$ so that the noise figure, as is well known, usually deteriorates when a large bias current is adopted. Furthermore, the level of maximum acceptable signal input to the balanced modulation circuit is determined by bias current in differential transistor pair $Q_5$-$Q_6$, and the external resistance connected between the terminals 9 and 10. When differential transistor pair $Q_5$-$Q_6$ is operatable in the condition of being out of a non-linear zone of saturation or cut-off, a value of amplitude $V_{smax}$ of signal input level, i.e., the maximum acceptable signal input level, applied to terminals 3-4, is given by $$V_{smax} = R_E \cdot I_B \quad (2),$$

where $R_E$ is the same as in Equation (1), $I_B$ represents the bias current values in differential transistor pair $Q_5$ and $Q_6$, equal bias currents $I_B$ being assumed to flow in transistors $Q_5$ and $Q_6$.

Thus, the principal characteristics of the double balanced modulation circuit, when used as the mixer at the front end portion of a signal receiver, are as described in the above.

It is a desire to improve the sensitivity of the mixer at the front end portion of signal receiver by means of a larger frequency conversion conductance and a low noise figure, and to reduce cross modulation distortion and inter modulation distortion by keeping the maximum acceptable signal input as large as possible. Upon review of the above-noted characteristics of the balanced modulation circuit, the above-noted desired performance is seen to be difficult to fully meet. In other words, if the frequency conversion conductance is intended to be increased, $R_E$, as seen from Equation (1), must be reduced, at which time the maximum acceptable signal input level deteriorates as seen from Equation (2). Accordingly, it is desired that bias current in Equation (2) is increased in order to increase the maximum acceptable input level without reducing the frequency conversion conductance. In this instance, a problem has been created in that the noise figure generally deteriorates.

SUMMARY OF THE INVENTION

This invention has been designed to overcome the above-noted problem created when the double balanced modulation circuit is used for the mixer at the front end portion of receiver. This invention is characterized in that when the signal input level to the receiver is small, the frequency conversion conductance and noise figure are made important so as to set each parameter shown in Equation (1) and (2) so that these characteristics are kept in good condition. On the other hand, when the signal input level to the receiver is larger, each parameter is set so that the maximum acceptable signal input level shown in Equation (2) becomes larger. Simultaneously, the local signal level is made small to reduce the frequency conversion conductance so that the cross modulation distortion and inter modulation distortion are restricted as much as possible, such distortion being generated by an increase in voltage amplitude of intermediate frequency signal converted in frequency at the output end of balanced modulation circuit when a greater signal is fed thereinto.

BRIEF DESCRIPTION OF THE DRAWINGS

Next, an embodiment of the invention will be described in accordance with the accompanying drawings, in which.

DESCRIPTION OF THE PREFERRED EMBODIMENT

Figure 2:
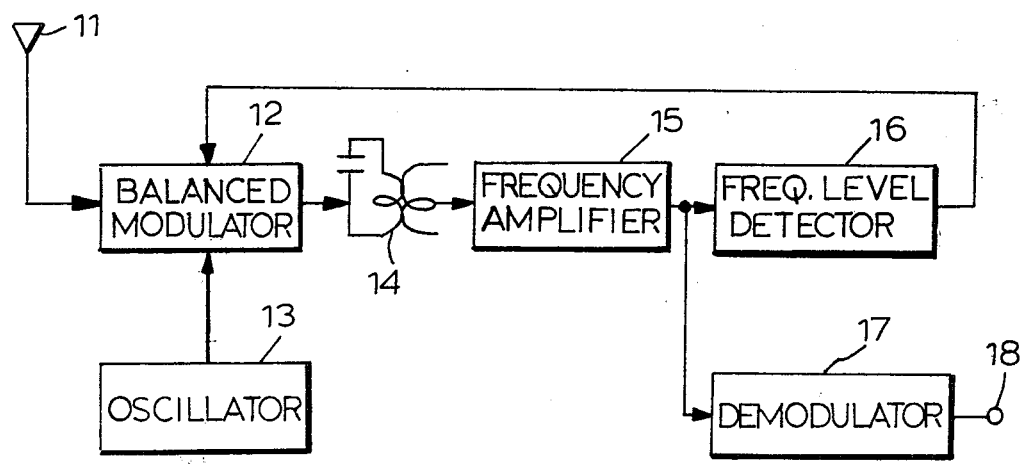
FIG. 2 is a block diagram of a signal receiver using the balanced modulation circuit of the invention.
Figure 3:
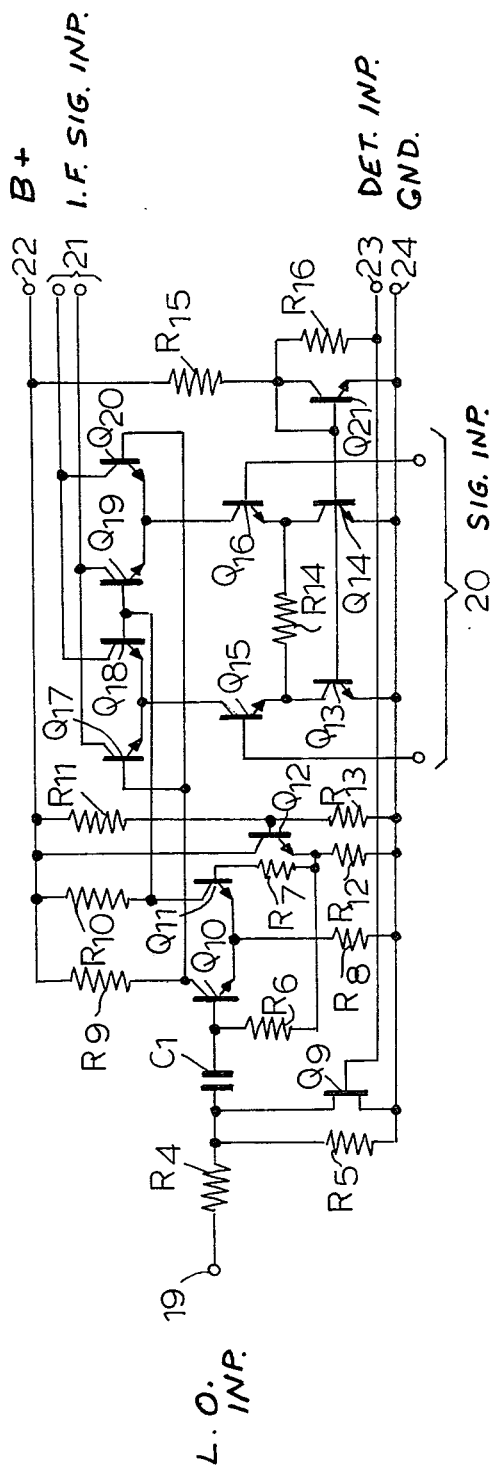
FIG. 3 is a circuit diagram of an embodiment of the balanced modulation circuit of the invention.

FIG. 2 is a block diagram of a typical receiver including a balanced modulator of the invention. FIG. 3 is a circuit diagram of an embodiment of the balanced modulator of the invention, which is composed mainly of a double balanced modulation circuit having a performance in accordance with the present invention. In FIG. 2, a received signal is given to the signal input terminals of a balanced modulator 12 through an antenna 11 (a radio frequency amplifier and frequency tuning circuit are omitted for simplifying the description), the balanced modulator 12 being supplied with oscillator signal from a local oscillator 13 through local signal injection terminals. The balanced modulator 12 also is supplied with output signal derived from an intermediate frequency level detector 16. By utilizing the fact that the output signal from the intermediate frequency level detector 16 increases when the received signal level is larger, the bias current of the double balanced modulation circuit included in balanced modulator 12 is increased, and the local signal injection level to the double balanced modulation circuit is reduced when the received signal level is large. Output of the balanced modulator 12 is given to an intermediate frequency amplifier 15 through an intermediate frequency filter 14, and the output of the intermediate frequency amplifier 15 being given to the intermediate frequency level detector 16 and to a demodulator 17. Output of the demodulator 17 is given through a terminal 18 at demodulator 17 to a audio amplifier (not shown) at the rear stage, and an audio output is obtained by use of a speaker or the like.

The embodiment of balanced modulator 12 shown in FIG. 2 will be detailed in accordance with FIG. 3. In addition, the intermediate frequency level detector 16, a local oscillator circuit 13, intermediate frequency amplifier 15 and envelope detector circuit, etc., and the signal demodulator of AM or FM, can be materialized by the well-known art, thereby omitting a further detailed description regarding them.

The relationship between the interconnection of each block of FIG. 2 with each terminal of balanced modulator 12 in FIG. 3, corresponding to that of FIG. 2, will be described. In FIG. 2, the signal input terminals connected to the antenna correspond to terminals 20 in FIG. 3, the terminals, into which the local oscillator signal is injected, correspond to a terminal 19 in FIG. 3, and the signal input terminals for signal converted of its frequency and given to intermediate frequency filter 14, correspond to terminals 21 in FIG. 3. In FIG. 3, a terminal 23 is to be connected with the output of intermediate frequency level detector 16 shown in FIG. 2, and terminals 22, 24 are connected with the power source and earth respectively.

Figure 1:
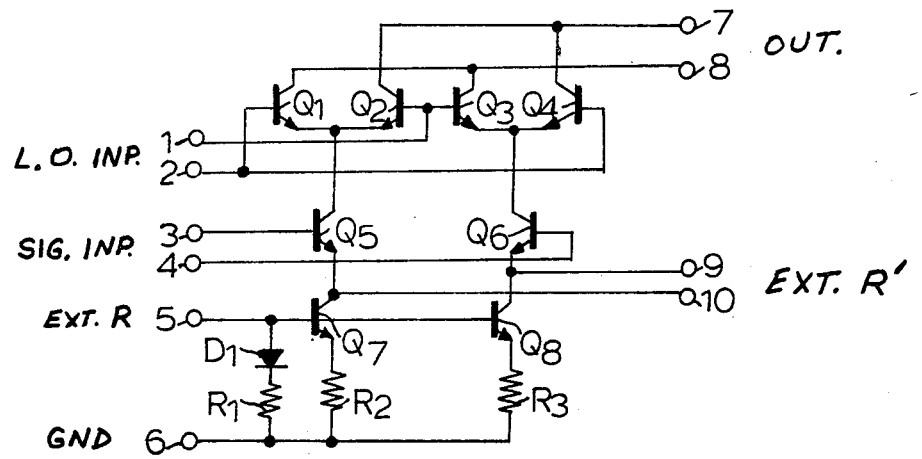
FIG. 1 is a circuit diagram of a prior art doublebalanced modulator.

The function of balanced modulator 12 shown in FIG. 3 will now be detailed. Firstly, transistors $Q_{17}$, $Q_{18}$, $Q_{19}$, $Q_{20}$, $Q_{15}$ and $Q_{16}$ and resistance $R_{14}$, constitute a double balanced modulation circuit which functions similarly to and correspondingly to the double balanced modulation circuit shown in FIG. 1. Transistors $Q_{13}$–$Q_{14}$ are constant current sources with respect to transistors $Q_{15}$–$Q_{16}$, and are determined and controlled by an output signal, which is derived from intermediate frequency level detector 16, and which is supplied to transistor $Q_{21}$, resistances $R_{15}$–$R_{16}$ and terminal 23 so as to operate under the principle of a current mirror.

Hence, as seen from Equation (2), the maximum acceptable input signal level for the double balanced modulation circuit is controlled by the intermediate frequency level, i.e., the input signal level. In addition, resistance $R_{14}$ serves to determine frequency conversion conductance of the double balanced modulation circuit. Secondly, the local oscillator signal applied to terminal 19 is first supplied to a differential amplifier comprising transistors $Q_{10}$–$Q_{11}$, and resistances $R_6$, $R_7$, $R_8$, $R_9$ and $R_{10}$, by way of an inverse-L-like type attenuator comprising resistances $R_4$–$R_5$ and a field-effect transistor (to be hereinafter called FET) $Q_9$. The FET $Q_9$ is introduced as a variable impedance element by which the a.c. impedance between the drain and the source is controlled by the voltage between the gate of FET and its source, and is so constituted that the output signal, which is derived from intermediate frequency level detector 16, and which is applied to terminal 23, and in turn the input signal level, controls impedance of the transistor $Q_9$, whereby when a voltage is supplied to terminal 23 so that the direct current increases in the normal direction, then the impedance is lowered. The differential amplifier composed mainly of the transistors $Q_{10}$–$Q_{11}$ serves to transmit the local oscillator signal to the double balanced modulation circuit, and simultaneously serves to supply a d.c. bias voltage thereto. An emitter follower circuit comprising transistor $Q_{12}$, and resistances $R_{11}$, $R_{12}$ and $R_{13}$, serves to feed a base bias voltage to said differential amplifier mainly comprising transistors $Q_{10}$–$Q_{11}$. In addition, a condenser $C_1$ in FIG. 3 is for the connection with the local oscillator signal.

Assuming that output voltage of the intermediate frequency level detector 16 shown in FIG. 2 is given the characteristic of increasing in the normal direction following an increase of input voltage of the detector 16, the voltage being applied to the input terminal 23 shown in FIG. 3 and changing likewise of direct current, increases in the normal direction as the signal input voltage from antenna 11 increases. Consequently, in this instance, bias currents in transistors $Q_{15}$–$Q_{16}$ increase following an increase in the signal input voltage from antenna 11, whereby the maximum acceptable input signal level increases as shown by Equation (2). A.C. impedance of FET $Q_9$ lowers to reduce the local oscillator injection level into the double balanced modulation circuit, so that the frequency conversion conductance is lowered to thereby lower the cross modulation distortion and inter modulation distortion caused by an increase of the intermediate frequency signal level converted in frequency at the output terminal 21.

Alternatively, this invention may of course introduce a bipolar transistor instead of FET $Q_9$, or introduce a variable attenuation circuit for a signal utilizing a more complex multiplier or the like.

When the received signal level from antenna 11 is small enough, it is of course preferable that bias currents in transistors $Q_{15}$–$Q_{16}$ at the double balanced modulation circuit shown in FIG. 3 and the injection level of local oscillation signal applied to the double balanced modulation circuit, are set to an optimum level in consideration of the noise figure.

As seen from the above, this invention can obtain the balanced modulation circuit which generates less cross modulation distortion and inter modulation distortion throughout a wide range of the received signal level and has the characteristic of low noise with respect to a small received signal level.

What is claimed is:

1. A balanced modulator characterized in that said modulator is provided with a transistor balanced modulation circuit of a double balanced type using a plurality of emitter coupled transistor pairs, means for increasing bias current in said balanced modulation circuit correspondingly to an increase in an input signal level, and means for reducing local oscillation signal applied to said balanced modulation circuit, correspondingly to an increase in the input signal level, so that distortion in said balanced modulation circuit may be reduced throughout a wide range of said input signal level.

* * * * *